United States Patent [19]

Keller et al.

[11] Patent Number: 5,568,868
[45] Date of Patent: Oct. 29, 1996

[54] GULL-WING IC CARRIER SYSTEM

[75] Inventors: Rex W. Keller, Phoenix; Robert Harlock, Cave Creek; Robert W. Hooley, Scottsdale; Patrick Harper, Phoenix, all of Ariz.

[73] Assignee: Precision Connector Designs, Inc., Peabody, Mass.

[21] Appl. No.: 516,531

[22] Filed: Aug. 18, 1995

[51] Int. Cl.⁶ .................................................. B65D 73/02
[52] U.S. Cl. ........................................ 206/724; 206/480
[58] Field of Search ................................ 206/701, 706, 206/709, 719, 722, 724, 480

[56] References Cited

U.S. PATENT DOCUMENTS

| | | | |
|---|---|---|---|
| 4,767,984 | 8/1988 | Bakker | 206/724 X |
| 5,131,535 | 7/1992 | O'Connor et al. | 206/722 |
| 5,266,037 | 11/1993 | Hetzel et al. | |
| 5,301,416 | 4/1994 | Foerstel | |

Primary Examiner—Jacob K. Ackun
Attorney, Agent, or Firm—Jacob N. Erlich; Edwin H. Paul; Jerry Cohen

[57] ABSTRACT

An integrated circuit carrier system having a carrier frame made up of a plurality of juxtaposed sides and an interior configuration sized to matingly engage an integrated circuit package. The integrated circuit package fits within the frame and is held in position therein by a plurality of locking clips which slidably engage a plurality of top and bottom channels diagonally disposed at each of the corners of the frame. Each locking clip is made up of a substantially C-shaped structure having an uppermost leg and a lowermost leg. The uppermost leg ends in a substantially perpendicularly disposed locking tab and the lowermost leg has a variety of locking arrangements, one of which permits the locking clip to be locked in two locking positions. In one locking position the integrated circuit package is held securely in place while in the other locking position the integrated circuit package may be inserted or removed from the carrier.

13 Claims, 4 Drawing Sheets

5,568,868

GULL-WING IC CARRIER SYSTEM

FIELD OF THE INVENTION

The present invention relates generally to integrated circuit (IC) carriers and, more particularly, to an IC carrier system for a gull-wing IC that mechanically and electrically protects the IC package and leads, and incorporates therein a uniquely designed fastening arrangement.

BACKGROUND OF THE INVENTION

One form of integrated circuit package, called gull-wing because of the shape of the leads, is a popular surface mount design that is easy to solder and inspect. But since the leads are thin and extend away from the body of the package the leads are easily bent or broken. It is important to protect these leads especially for expensive large scale integration (LSI) chips. LSI is herein used as a generally descriptive term for any of the larger packages with large ICs, multiple hybrid ICs, or any other composite type construction. LSI is not limited to a narrow definition.

IC manufacturers routinely package these ICs in trays or carriers that protect the IC pack from static charge and physical harm during routine handling and shipping. It is important to protect the fragile leads. These trays or carriers often provide guides that substantially enclose the leads. Such guides prevent the test/burn-in or other use of the ICs while still packaged.

IC end users and test houses prefer, to reduce handling of the chip (herein defined as the packaged IC), to use the trays in which the chips are shipped. ICs often go through a series of handling operations that are a source of failure for such ICs; the ICs are: removed from the shipping carriers, placed in programming/test/burn-in fixtures, programmed/tested, repackaged for stocking or subsequent shipping, and then placed in another socket/fixture or soldered to a PCB for use. This handling (or mishandling) is a source of harm to the ICs.

Sockets are routinely used on PC boards to allow the IC to be changed or interconnections modified as the circuitry and programming are being debugged or upgraded. But in production, sockets are a source of failure, usually due to mechanical problems of alignment, unreliable electrical contacts and sometimes added capacitance and inductance associated with the socket itself. In addition there is an added cost of the socket. Sockets are often bulky with high profiles obviating their use in closely stacked board assemblies. These negatives are balanced by the ability of replacing or reprogramming the chip without damaging the PC board. This is important since LSI chips and completed PC boards are expensive, and replacing a soldered on chip without damaging the board or the replacement chip is a skill that is not routinely done nor recommended in production or even in development environments.

As shown in U.S. Pat. No. 5,266,037 the IC package is maintained within the carrier by a pair of spring clips. It is important that the IC package be held within the carrier in a fixed relationship thereto and prevent any damage to be inflicted to the IC package during transport or use.

It is clearly evident that the need for holding IC packages within the carrier is of great importance, especially with respect to gull-wing leaded integrated circuits.

It is therefore an object of this invention to provide an integrated circuit carrier system which effectively holds an integrated circuit (IC) package in position within the carrier during transportation and/or testing thereof.

It is a further object of this invention to provide an integrated circuit carrier system which incorporates therein four oppositely disposed locking clips in order to securely hold the IC package within the carrier even if one of such clips are inadvertently removed or damaged.

It is even a further object of this invention to provide an integrated carrier system which incorporates uniquely designed locking clips capable of locking into two different positions. A first position which securely holds the IC package within the carrier, and a second position which allows for accessible placement of the IC package into the carrier without additional external forces to hold the clip in this locked state.

It is still another object of this invention to provide uniquely designed locking clips which are light weight, extremely sturdy in construction and yet inexpensive to manufacture.

SUMMARY OF THE INVENTION

The present invention overcomes problems associated with maintaining IC packages, particularly gull-wing leaded integrated circuits, within a carrier in a fixed, stable relationship with one another. This invention includes a unique fastening or locking arrangement which contains a series of spaced apart locking clips for matingly engaging the carrier. The locking clips are extremely rugged, inexpensive to manufacture and yet hold the IC package securely in position within the carrier. In addition, the positioning of four such clips at equally spaced intervals around the carrier enables the IC package to be held in fixed relationship with respect to the carrier even if one of such clips are damaged or accidentally removed.

Furthermore, a uniquely designed locking clip is capable of holding the IC package within the carrier in a first locking position and then is movable to a second locking position which allows for placement of the IC package into the carrier. The locking clips moving between the first and second locking positions permit for the easy insertion and extraction of the IC package without complete removal of the clips.

The carrier is constructed of a light weight material, preferably of a rectangular or square configuration, having a centrally located opening therein thereby forming a frame-like configuration. The internal configuration of the carrier is designed to matingly engage an IC package similar to the type illustrated and described within U.S. Pat. No. 5,266,037. At each corner of the carrier, preferably four in number, is an upper and lower diagonal channel. Each channel is embedded within a corner of interconnecting sides. There is a channel located in the uppermost side of the carrier and a channel located directly there beneath in the lowermost side of the carrier. A serious of, preferably, four uniquely designed locking clips slidably engage each of said pair of opposed channels, respectively. The locking clips securely position the IC package within the interior portion of the carrier. Each of the locking clips are designed such that when slid into position within each of the corners of the carrier are locked in place by a latching arrangement which cooperates with the carrier.

Furthermore, in an alternate embodiment of the invention the locking clips are uniquely designed to enable the clips to be held securely in a first and second locking position, passing through an intermediate non-locking position with respect to the carrier. In the first locking position the clips secure the IC package within the carrier frame and after moving through an intermediate position, the locking clips can be moved to a second locking position in which the clips are out of the way of the IC package in order to permit the easy insertion and extraction of the IC package from the carrier.

Each of the clips are designed so as economize the manufacture thereof and yet are of extremely high strength. They are made of a nonconductive material and do not interfere with any testing procedure which may take place. The carrier also includes a pair of opposed extensions in order to aid in the transportation of the carrier from one location to another.

For a better understanding of the present invention, together with other and further objects, reference is made to the following description taken in conjunction with the accompanying drawings, and its scope will be pointed out in the appended claims.

DETAILED DESCRIPTION OF THE PREFERRED EMBODIMENTS

Figure 1:
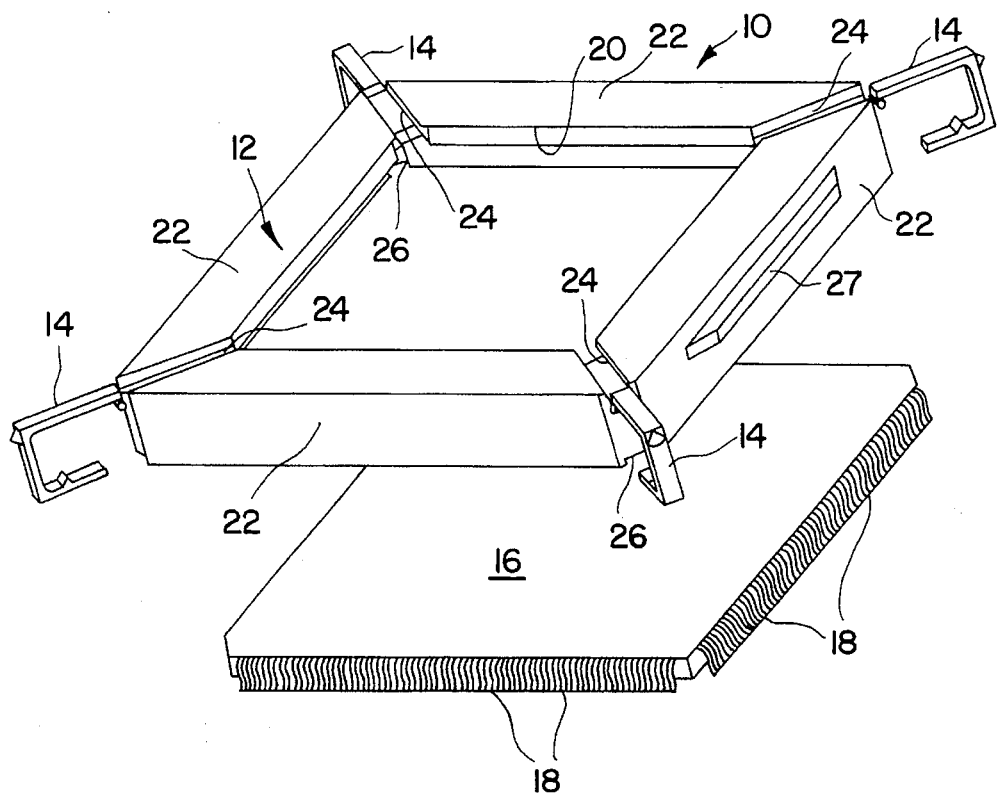
FIG. 1 is an exploded pictorial illustration of the carrier of the present invention illustrating the clips and the IC package.

Referring to FIG. 1 of the drawings, the integrated circuit carrier system 10 of the present invention is made up of a carrier body portion 12 and a plurality of locking clips 14, preferably four in number, and located at each corner of the carrier body 12. The integrated circuit package 16 with its gull-wing leads 18 is shown in position external from the carrier 10 in FIG. 1. This IC package may be similar to the type described in U.S. Pat. No. 5,266,037. Carrier 12 may be made of any easy to fabricate material known in the industry such as, e.g., polysulfone, polyarylsulfone, or polyethersulfone. However the material from which the carrier 12 is made can vary in accordance with the scope of this invention.

Carrier 12 is preferably molded in the shape of a square or a rectangle in order to house the IC package 16 therein. Generally the carrier 12 has an opening 20, centrally located therein, and is made up of a plurality of sides 22 having at each corner thereof a top diagonal channel or groove 24 in order to receive therein the clips 14 as illustrated in FIG. 1 of the drawings. In addition, there is a channel or groove 26 on the bottom side of carrier 12 at each corner thereof in order to receive the base portion of the clip 14 also illustrated in FIG. 1 of the drawings. The interlocking relationship between the plurality of clips 14 and the channels or grooves 24 and 26 of carrier 12 will be explained in greater detail hereinafter. The carrier also includes a pair of opposed extensions in order to aid in the transportation of the carrier from one location to another.

Figure 2:
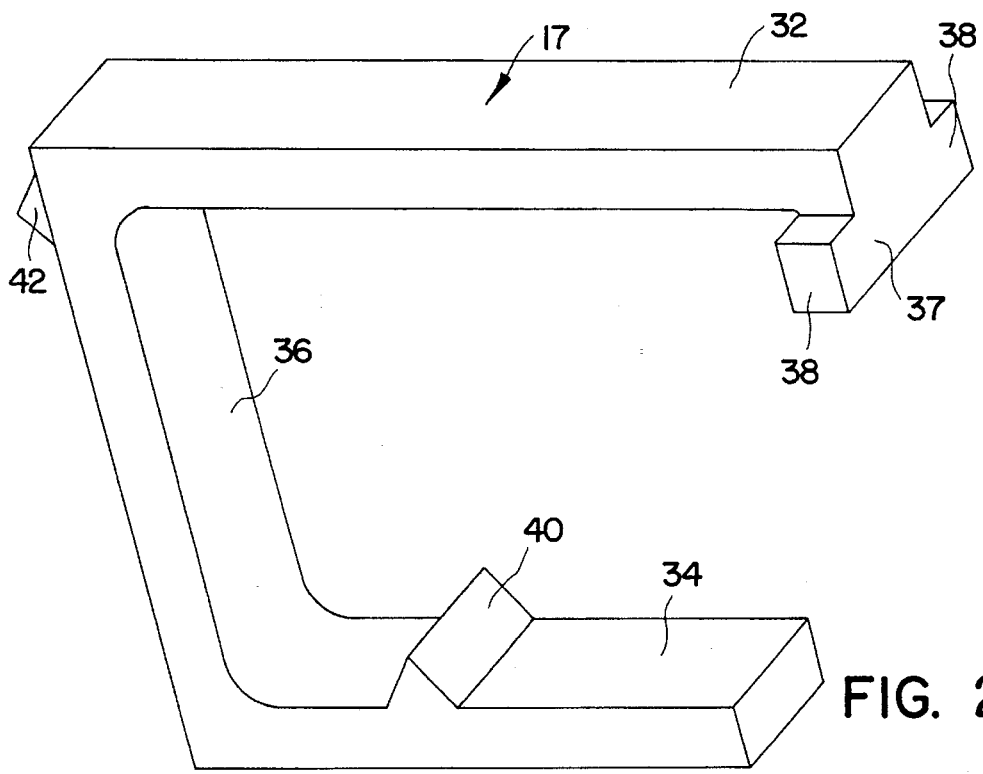
FIG. 2 is a pictorial illustration of one embodiment of the locking clip of the present invention.

FIG. 2 pictorially represents one embodiment of the locking clip 14 of this invention. Clip 14 is also made of a nonconductive material of C-shape configuration having a pair of legs 32 and 34 extending from a back brace 36, the entire clip 14 being molded of a single piece of material. In addition, upper leg 32 has protruding from its outer end thereof a locking element 37, including a pair of horizontally disposed extensions 38. The bottom leg 34 has a protrusion 40 extending approximately midpoint thereon in a pyramid fashion which is utilized to lock the lower leg 34 in place in the bottom of carrier 12. Extending from the back side of back brace 36 is a strengthening tab 42 which adds strength to the light weight clip structure and accommodates any flexing or bending of the clip as it is slid and inserted in place within channels 24 and 26.

Figure 3:
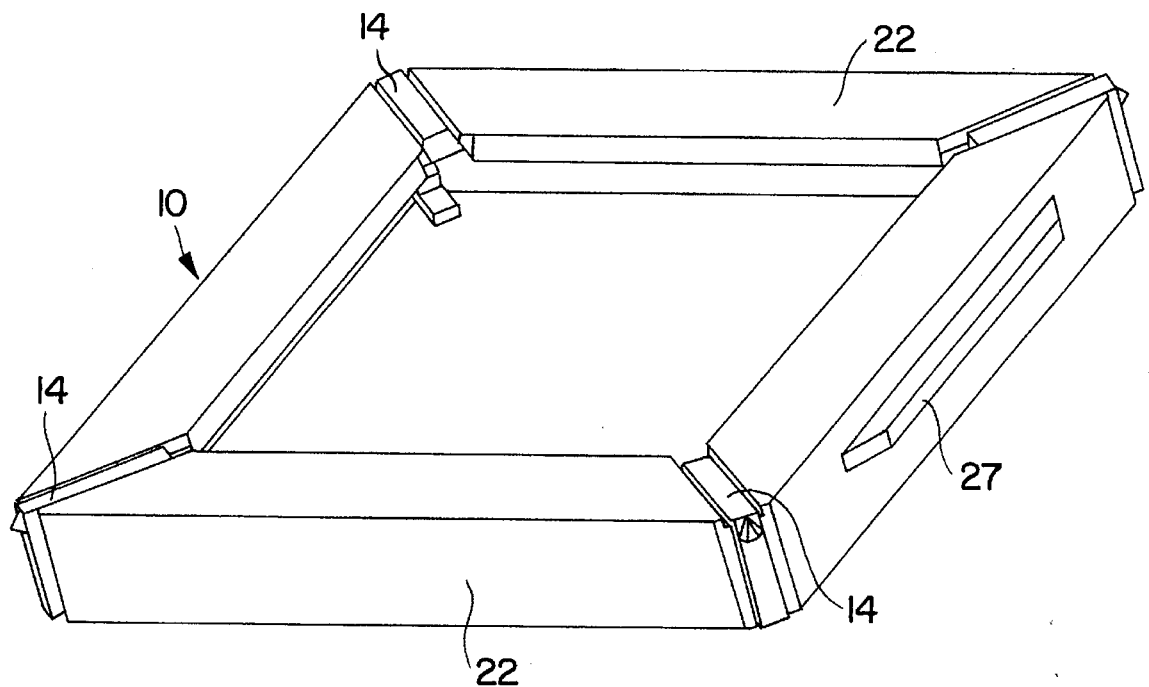
FIG. 3 is a pictorial illustration of the carrier of the present invention with the clips in its inserted position within the carrier.

As shown in FIG. 3 of the drawings, and still referring to FIG. 1 of the drawings, clips 14, upon the positioning of IC package 16 in place within the inner confines of carrier 12, are slid within the grooves 24 and 26 and snapped in place such that it holds the bottom of the IC package securely within carrier 12. It is preferable in this invention to have four such clips utilized within carrier 12. The utilization of four oppositely disposed clips 14 enables IC package 16 to be securely in place within carrier 12 and yet in the event of loss or removal or breakage of one of the clips 14 the IC package will still remain in position and thereby eliminate damage thereto. Since these clips 14 are inexpensively manufactured and easily reproduced, the replacement of one or more of such clips while the IC package is in position within carrier 12 can be accomplished easily and inexpensively without loss or damage to the expensive IC package 16.

Figure 4:
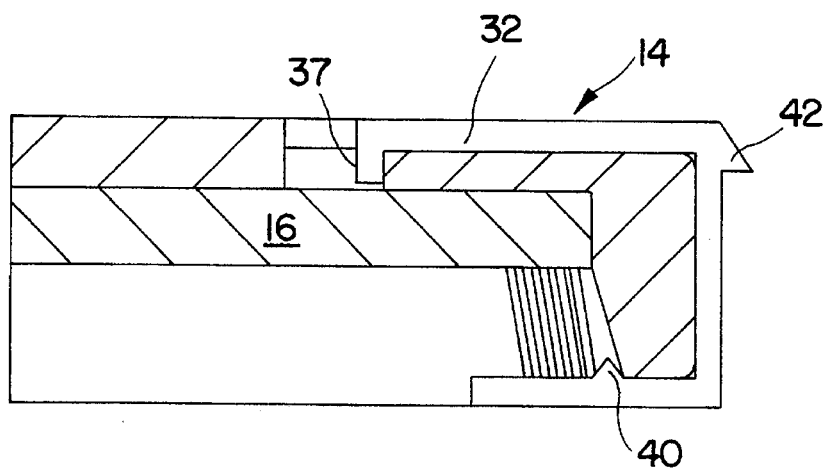
FIG. 4 is a side elevational view of the locking clip of the present invention in position within the carrier and holding an IC package in place therein.

Referring to FIG. 4 of the drawings, it is evident that the unique configuration of the clips 14, when used in conjunction with the design of the channels or grooves 24 and 26 of carrier 12, enable the locking elements 37 to be secured and snapped within position at the top surface of carrier 12. The positioning of bottom protrusion 40 beyond the inner surface of channel 26 of carrier 12 makes for a secure locking arrangement to prevent any accidental or inadvertent movement of the IC package 16 within carrier 12. If, by chance, it is necessary to remove the IC package 16 from its position within carrier 12 tab 42 may be used to help bend the upper leg 32 upward to enable the clip 14 to be removed from its locked position within carrier 12.

Figure 5:
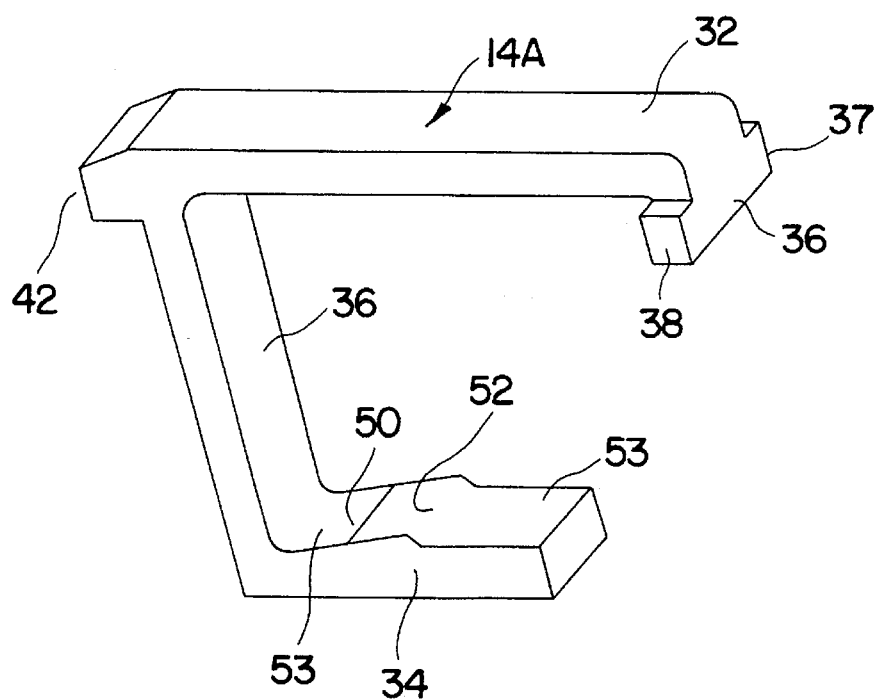
FIG. 5 is a pictorial illustration of another embodiment of the locking clip of this invention.

An alternate embodiment of the locking clip is shown in FIG. 5 of the drawings wherein the locking clip is depicted by numeral 14A and wherein like numerals are used to identify similar elements described above.

Figure 6A:
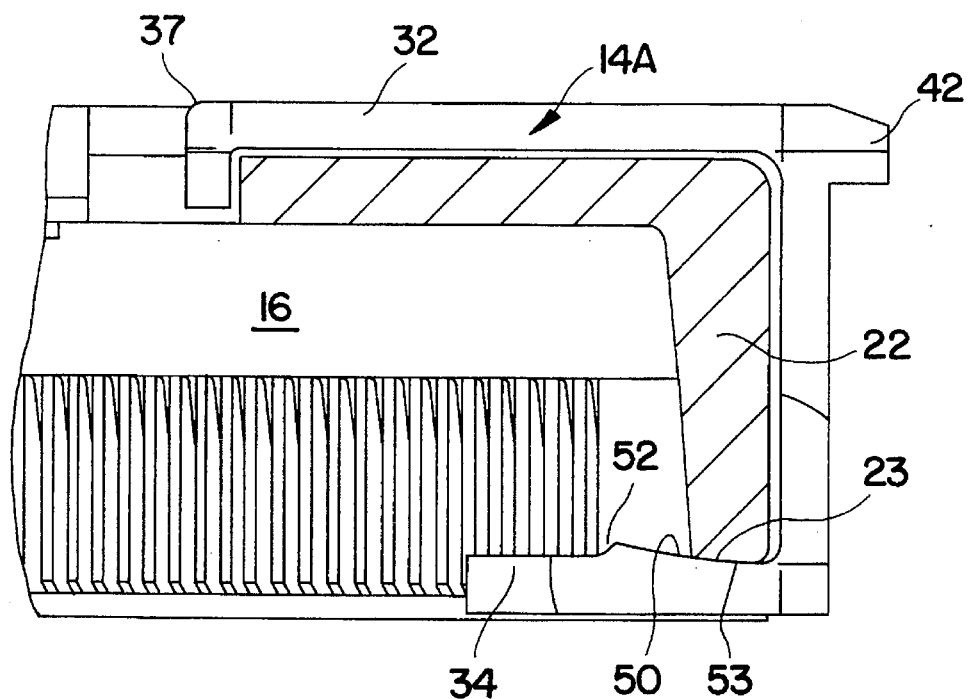
FIG. 6A is a side elevational view of the locking clip of FIG. 5 in a first locking position holding the IC package in place.
Figure 6B:
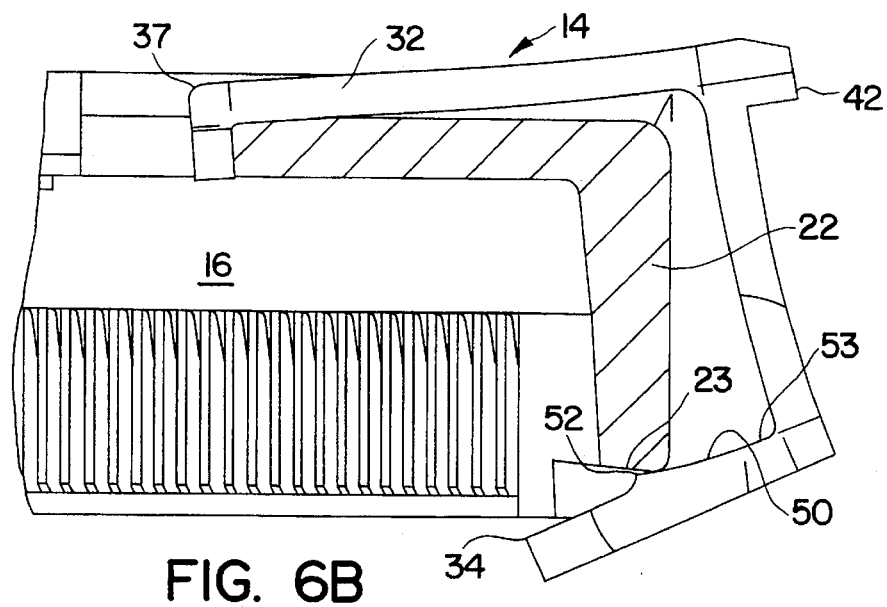
FIG. 6B is a side elevational view of the locking clip of FIG. 5 in an intermediate position.
Figure 6C:
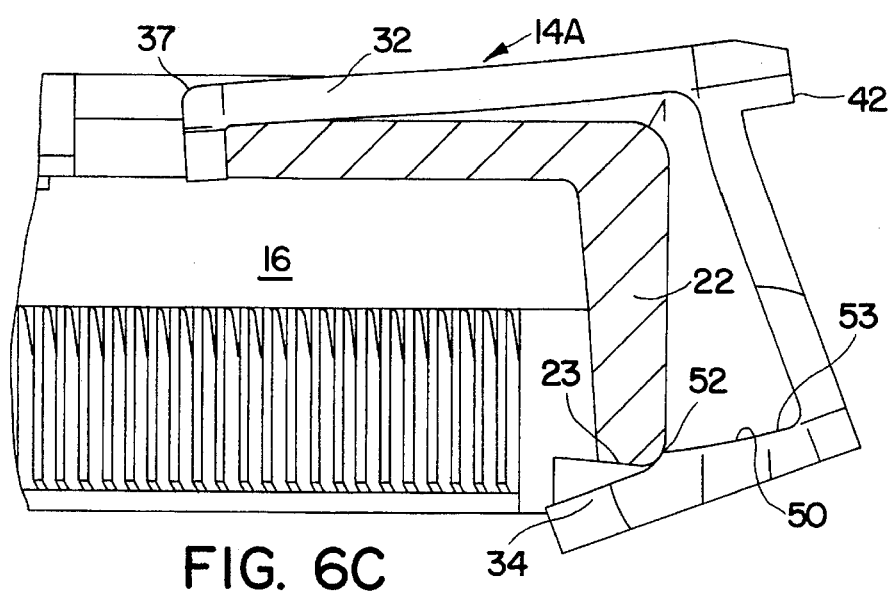
FIG. 6C is a side elevational view of the locking clip of FIG. 5 in a second locking position, permitting the removal of the IC package.

More specifically, locking clip 14A is configured similar to clip 14 except with respect to its bottom locking mechanism. Clip 14A has an upper leg 32, a lower leg 34 interconnected thereto by back brace 36. In addition, upper leg 32 has protruding from its outer end a locking element 37, including a pair of horizontally disposed extensions 38. The bottom leg 34 of locking clip 14A has an upper surface having a sloging portion 50 which begins at back brace 36 and slopes upwardly to a protrusion 52 in a cam-like fashion. Thereafter the upper surface at bottom leg 34 declines in slope to the end thereof. Sloging portion 50 is configured to slidably engage with the bottom 23 of carrier frame 22 as shown in FIGS. 6A–6C. The bottom 23 being shaped to permit this sliding relationship to take place until clip 14A is locked in either a first position (FIG. 6A) or a second position (FIG. 6C).

As clearly shown in FIG. 6A of the drawings locking clip 14A engages the bottom 23 of carrier 22 in one of three positions—a first locking position (FIG. 6A) in which IC package 16 is held securely in place, an intermediate position (FIG. 6B) in which clip 14A is moved out of the way of IC package 16, and a second locking position (FIG. 6C) completely out of the way of IC package 16. A portion 53 of surface 50 acts as a locking segment to lock clip 14A in the locking position adjacent the bottom 23 of frame 22.

In FIG. 6B, clip 14A is moved into an intermediate position away from IC package 16 and with further movement of clip 14A as shown in FIG. 6C the cam-like surface 50 slides against bottom 23 of frame 22 until protrusion 52 abuts bottom 23 as shown in FIG. 6C, the second locking position of clip 14A. Upward pressure applied to element 42 can be used to move clip 14A from its first locking position to its second locking position.

Thereafter, upon the insertion of IC package 16 into carrier frame 10, locking clip 14A can be returned to its first locked position to hold IC package 16 in place. This embodiment of the invention permits the easy insertion or withdrawal of IC package 16 from carrier 10.

Figure 7:
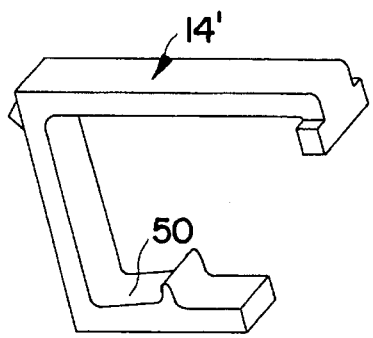
FIG. 7 is a pictorial illustration of a further alternate embodiment of the locking clip of this invention.
Figure 8:
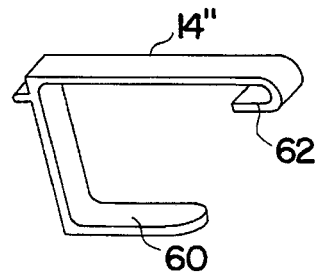
FIG. 8 is a pictorial illustration of a another embodiment of the locking clip of this invention.

Further embodiments of the clip 14 can be shown in FIGS. 7 and 8 of the drawings wherein FIG. 7 shows in pictorial fashion a clip 14B having a cam-like surface 63 terminating in a protrusion on the bottom thereof. The bottom groove or channel 26 of carrier 12 must be appropriately configured to meet the cam-like surface 50 so as to enable its insertion therein similar to the arrangement of FIG. 6.

FIG. 8 shows a clip 14C which has a flat bottom leg 60 and a curved hook-like end 62 on the upper end thereof. This hook-like element 62 enables the clip to be securely fastened within a carrier 12 having a surface portion thereof matingly configured to accommodate hook-like configuration 62.

Although the invention has been described with reference to particular embodiments, it will be understood that this invention is also capable of further and other embodiments within the spirit and scope of the appended claims.

What is claimed is:

1. An integrated circuit carrier system comprising:
   a carrier frame made up of a plurality of juxtaposed sides, said sides having an interior configuration sized to matingly engage an integrated circuit package;
   at least one pair of said juxtaposed sides forming a corner;
   a top channel formed in the top surface of said corner and a bottom channel formed in the bottom surface of said channel, said top and bottom channels being substantially aligned with each other and being diagonally disposed with respect to said frame; and
   a locking clip configured to matingly engage said top and bottom channel, said locking clip having means thereon for engaging said channels adjacent said corner;
   whereby, when said locking clip is in position within said top and bottom channels in said frame it secures said integrated circuit package within said frame.

2. An integrated circuit carrier system as defined in claim 1 further comprising:
   at least three of said corners, each of said corners having a top and bottom channel therein, and
   at least three of said locking clips for engaging said respective channels.

3. An integrated circuit carrier system as defined in claim 1 wherein said locking clip comprises:
   a substantially C-shaped structure having an uppermost leg, a lowermost leg and a back brace interconnecting said legs;
   said uppermost leg ending in substantially perpendicularly disposed locking tab, said locking tab configured to engage an end of said top channel; and
   said lowermost leg having a locking protrusion extending therefrom, said locking protrusion configured to engage an end of said bottom channel.

4. An integrated circuit carrier system as defined in claim 3 wherein said lowermost leg has a cam-like portion situated between said back brace and said locking protrusion.

5. An integrated circuit carrier system as defined in claim 1 wherein said locking clip comprises:
   a substantially C-shaped structure having an uppermost leg and a lowermost leg;
   said uppermost leg ending in a hook-like configuration to engage an end of said top channel; and
   said lowermost leg being of a relatively smooth configuration.

6. An integrated circuit carrier system as defined in claim 2 wherein each of said locking clips comprises:
   a substantially C-shaped structure having an uppermost leg and a lowermost leg;
   said uppermost leg ending in substantially perpendicularly disposed locking tab, said locking tab configured to engage an end of said top channel; and
   said lowermost leg having a locking protrusion extending therefrom, said locking protrusion configured to engage an end of said bottom channel.

7. An integrated circuit carrier system as defined in claim 6 wherein said lowermost leg has a cam-like portion situated between said back support and said locking protrusion.

8. An integrated circuit carrier system comprising:
   a carrier frame made up of a plurality of juxtaposed sides, said sides having a top surface and a bottom surface and having an interior configuration sized to matingly engage an integrated circuit package;
   at least one pair of said juxtaposed sides forming a corner;
   a channel formed in at least one surface of said corner and being diagonally disposed with respect to said frame; and
   a locking clip configured to have a portion thereof fit within said channel and further having means thereon for engaging said corner in two locking positions and a third intermediate position such that when said locking clip is in a first locking position in said frame it fixedly secures said integrated circuit package within said frame, and, after passing through said intermediate position, when said locking clip is in a second locking position in said frame it allows said integrated circuit to be inserted or withdrawn from said frame.

9. An integrated circuit carrier system as defined in claim 4 wherein said locking clip comprises:

a substantially C-shaped structure having an uppermost leg, a lowermost leg and a back brace interconnecting said legs;

said uppermost leg ending in a substantially perpendicularly disposed locking tab, said locking tab configured to engage an end of the top surface of said frame; and said lowermost leg having an upper surface defining a cam-like portion extending from said back brace and terminating in a protrusion, a segment of said cam-like portion adjacent said back brace constituting a locking segment for engaging the bottom of said carrier in said first locking position, and said protrusion configured for engaging said bottom of said carrier in said second locking position.

10. An integrated circuit carrier system as defined in claim 9 wherein the bottom surface of said corner is configured to matingly engage said cam-like portion of said lowermost leg.

11. An integrated circuit carrier system as defined in claim 10 wherein said channel constitutes a top channel formed in the top surface of said corner, and said carrier system further comprises:

a bottom channel formed in the bottom surface of said corner, said top and bottom channels being substantially aligned with each other and being diagonally disposed with respect to said frame; and said locking clip configured to slidably fit within said top and bottom channels.

12. An integrated circuit carrier system as defined in claim 11 further comprising a tab protruding from said back brace of said locking clip.

13. An integrated circuit carrier system as defined in claim 11 further comprising:

at least three of said corners, each of said corners having top and bottom channels therein, and at least three of said locking clips for engaging said respective channels.

* * * * *